(12) United States Patent
Mori et al.

(10) Patent No.: US 10,528,202 B2
(45) Date of Patent: Jan. 7, 2020

(54) PIEZOELECTRIC SENSOR, TOUCH PANEL, TOUCH INPUT DEVICE, AND DISPLAY DEVICE

(71) Applicant: Murata Manufacturing Co., Ltd., Nagaokakyo-shi, Kyoto-fu (JP)

(72) Inventors: Kenichi Mori, Nagaokakyo (JP); Hidekazu Kano, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 74 days.

(21) Appl. No.: 15/828,988

(22) Filed: Dec. 1, 2017

(65) Prior Publication Data

US 2018/0101261 A1    Apr. 12, 2018

Related U.S. Application Data

(63) Continuation of application No. PCT/JP2016/070631, filed on Jul. 13, 2016.

(30) Foreign Application Priority Data

Jul. 15, 2015 (JP) .................... 2015-141551

(51) Int. Cl.
| | | |
|---|---|---|
| *G06F 3/044* | (2006.01) | |
| *G02F 1/133* | (2006.01) | |
| *G02F 1/1333* | (2006.01) | |
| *G02F 1/1335* | (2006.01) | |

(Continued)

(52) U.S. Cl.
CPC .......... *G06F 3/044* (2013.01); *G02F 1/13306* (2013.01); *G02F 1/13338* (2013.01);
(Continued)

(58) Field of Classification Search
CPC ................. G02B 5/30; G06F 3/0414; G06F 2203/04103; G06F 3/0412; G06F 3/044;
(Continued)

(56) References Cited

U.S. PATENT DOCUMENTS

| | | | |
|---|---|---|---|
| 2015/0338981 A1 | 11/2015 | Ando et al. | |
| 2016/0077649 A1 | 3/2016 | Ando et al. | |
| 2016/0130387 A1* | 5/2016 | Sato ........................ | C08J 5/18 |
| | | | 528/361 |

FOREIGN PATENT DOCUMENTS

| | | | |
|---|---|---|---|
| JP | 2009-169837 A | 7/2009 | |
| JP | 2012-230657 A | 11/2012 | |

(Continued)

OTHER PUBLICATIONS

International Search Report issued in International Application No. PCT/JP2016/070631, dated Sep. 13, 2013.

(Continued)

*Primary Examiner* — Charles V Hicks
(74) *Attorney, Agent, or Firm* — Arent Fox LLP

(57) ABSTRACT

A piezoelectric sensor includes: a piezoelectric sheet which is stretched in a uniaxial direction; an electrode which detects electric charges generated in the piezoelectric sheet; and an optical compensation layer which includes a slow axis stacked on at least one side of the piezoelectric sheet and intersects the uniaxial direction, and optically compensates for a phase difference produced when the piezoelectric sheet is stretched in the uniaxial direction.

16 Claims, 8 Drawing Sheets

(51) Int. Cl.
*G02F 1/13363* (2006.01)
*H01L 41/08* (2006.01)
*H01L 41/113* (2006.01)

(52) U.S. Cl.
CPC .... *G02F 1/13363* (2013.01); *G02F 1/133528* (2013.01); *H01L 41/0805* (2013.01); *H01L 41/1132* (2013.01); *G06F 2203/04103* (2013.01)

(58) Field of Classification Search
CPC ............ H01L 41/0805; H01L 41/1132; H01L 41/0477; H01L 41/0478; H01L 41/193; G02F 1/13338; G02F 1/13306; G02F 2001/133394; G02F 1/13363; G02F 1/133528
See application file for complete search history.

(56) References Cited

FOREIGN PATENT DOCUMENTS

| | | |
|---|---|---|
| JP | 2015-95696 A | 5/2015 |
| WO | WO 2014/119476 A1 | 8/2014 |
| WO | WO 2014/192541 A1 | 12/2014 |

OTHER PUBLICATIONS

Written Opinion of the International Searching Authority issued in International Application No. PCT/JP2016/070631, dated Sep. 13, 2013.

* cited by examiner

| CHANGE RATE FROM OPTIMAL Re | TONE EVALUATION | CHANGE RATE FROM OPTIMAL Re | TONE EVALUATION |
|---|---|---|---|
| +10% | ○ | -10% | ○ |
| +20% | ○ | -20% | ○ |
| +30% | ○ | -30% | ○ |
| +40% | △ | -40% | × |
| +50% | × | -50% | × |

PIEZOELECTRIC SENSOR, TOUCH PANEL, TOUCH INPUT DEVICE, AND DISPLAY DEVICE

CROSS REFERENCE TO RELATED APPLICATIONS

The present application is a continuation of International application No. PCT/JP2016/070631, filed Jul. 13, 2016, which claims priority to Japanese Patent Application No. 2015-141551, filed Jul. 15, 2015, the entire contents of each of which are incorporated herein by reference.

TECHNICAL FIELD

The present invention relates to a piezoelectric sensor, a touch panel including the piezoelectric sensor, a touch input device, and a display device.

BACKGROUND ART

Japanese Patent Application Laid-Open No. 2012-230657 discloses a display panel in which a top surface polarizing plate is disposed on an operation surface (outermost surface). In this display panel, a touch panel is disposed on a surface opposite to the operation surface of the top surface polarizing plate. A liquid crystal panel formed by a pair of glasses sandwiching a liquid crystal is disposed on the side opposite to the top surface polarizing plate of the touch panel.

Japanese Patent Application Laid-Open No. 2015-095696 discloses a display device which detects a pressing operation (i.e., a pressing force on the touch panel, typically a force which is greater than a predetermined value) using a uniaxially stretched piezoelectric sheet.

However, a piezoelectric sheet produces birefringence when uniaxially stretched. Therefore, when, for example, a display image is viewed with polarizing sunglasses on, a phase difference of the piezoelectric sheet changes wavelength characteristics of the light intensity, and changes a tone of images.

For example, by making a polarization direction of the top polarizing plate of the display panel and the uniaxial stretching direction of the piezoelectric sheet parallel or orthogonal, it is possible to eliminate the influence of the phase difference of the piezoelectric sheet on the optical characteristics.

However, due to manufacturing variations of the piezoelectric sensor, manufacturing variations of the display panel, or assembly variations of the piezoelectric sensor and the display panel, a parallel or orthogonal state of the polarization direction of the top polarizing plate of the display panel and the stretching direction of the piezoelectric sheet may not be realized. Further, the stretching direction of the piezoelectric sheet which is optimal for detecting a pressing operation, and the polarization direction of the top polarizing plate of the display panel are not necessarily in the parallel or orthogonal state. When the polarization direction of the top polarizing plate of the display panel and the stretching direction of the piezoelectric sheet are not in the parallel or orthogonal state, a tone of images changes when a displayed image is viewed with the polarization sunglasses on.

BRIEF DESCRIPTION OF THE INVENTION

The present invention provides a piezoelectric sensor, a touch panel, a touch input device, and a display device which can suppress a change in a tone of images when a displayed image is viewed with polarization sunglasses on, even when a polarization direction of a top polarizing plate of a display panel and a stretching direction of a piezoelectric sheet are not in a parallel or orthogonal state.

A piezoelectric sensor according to the present invention includes: a piezoelectric sheet which is stretched in a uniaxial direction; an electrode which detects an electric charge generated in the piezoelectric sheet; and an optical compensation layer which includes a slow axis disposed on at least one side of the piezoelectric sheet and intersects the uniaxial direction, and optically compensates for a phase difference produced when the piezoelectric sheet is stretched in the uniaxial direction.

Thus, the piezoelectric sensor has the optical compensation layer on an upper surface or a lower surface of the piezoelectric sheet. The optical compensation layer includes the slow axis which intersects the stretching direction of the piezoelectric sheet. The phase difference of the optical compensation layer and the phase difference of the piezoelectric sheet cancel each other out. Consequently, even when the polarization direction of the top polarizing plate of the display panel and the stretching direction of the piezoelectric film are not in the parallel or orthogonal state, it is possible to suppress a tone of images when a displayed image is viewed with the polarization sunglasses on.

In this regard, the piezoelectric sheet may be PVDF. A chiral polymer with high transparency is preferably used for use in the display device. Further, the chiral polymer is more preferably uniaxially stretched polylactic acid (PLA), and is still more preferably poly-L-lactide (PLLA).

In this regard, the electrode is formed on the electrode film, and the electrode film is the optical compensation layer. Consequently, it is possible to form the optical compensation layer without providing a new layer.

Even when a polarization direction of a top polarizing plate of a display panel and a stretching direction of a piezoelectric film are not in a parallel or orthogonal state, the present invention can suppress a change in a tone of images when a displayed image is viewed with polarization sunglasses on.

MODE FOR CARRYING OUT THE INVENTION

Hereinafter, an example of a display device which includes a piezoelectric sensor according to the present invention will be described with reference to the drawings.

Figure 1:
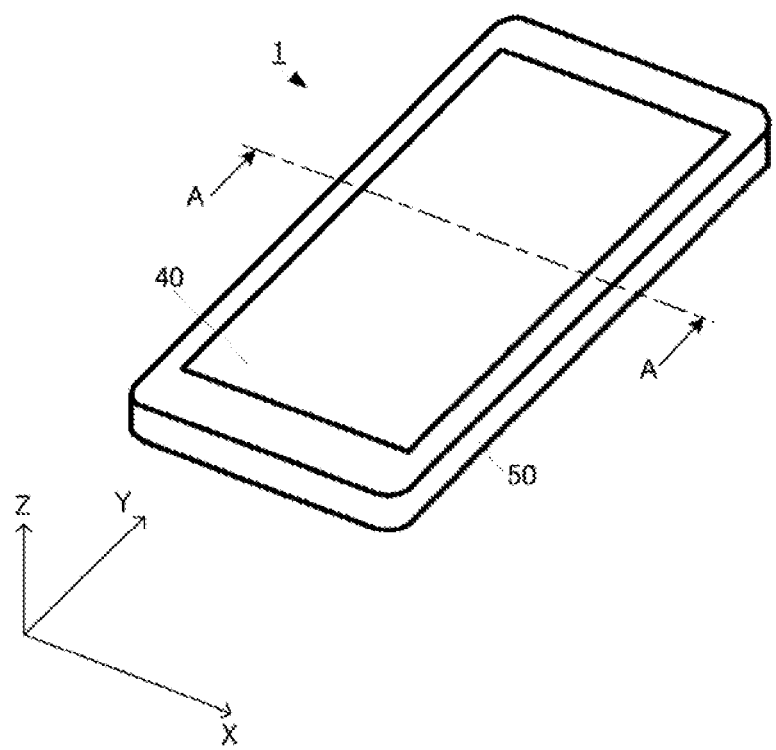
FIG. 1 is an external appearance perspective view of a display device.

As illustrated in an external appearance perspective view in FIG. 1, a display device 1 includes a housing 50 having a cuboid shape and a top surface panel 40 of a planar shape which is disposed in an opening in an upper surface of the housing 50 from a viewpoint of external appearance. The top surface panel 40 functions as an operation surface on which a user performs a touching operation by using a finger, a pen or other object.

In addition, in the present embodiment, a width direction (horizontal direction) of the housing 50 is an X direction, a length direction (vertical direction) is a Y direction, and a thickness direction is a Z direction.

Figure 2:
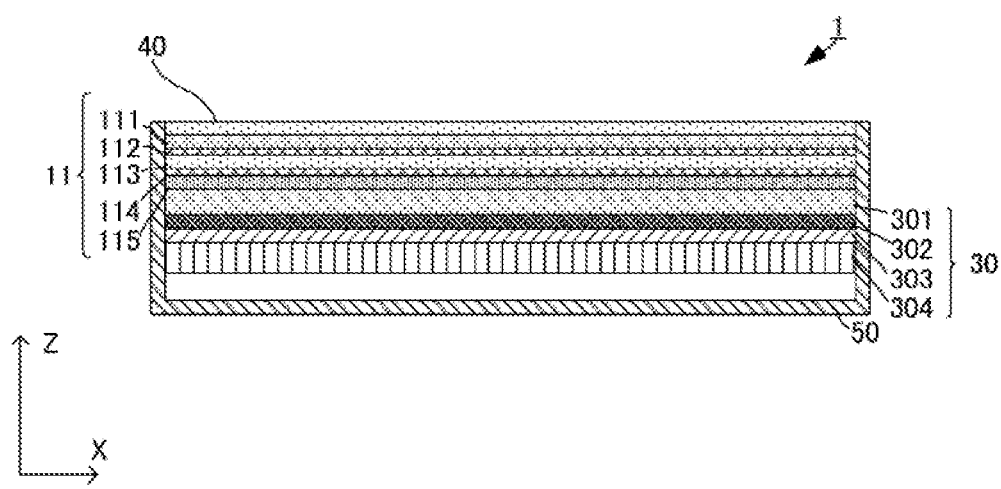
FIG. 2 is a side cross-sectional view of the display device.

As illustrated in FIG. 2, a piezoelectric sensor 11 and a display panel 30 are disposed along the Z direction in order from a side of the opening (top surface panel 40) of the housing 50 inside the housing 50. The top surface panel 40 and the piezoelectric sensor 11 form a touch panel.

The piezoelectric sensor 11 and the display panel 30 preferably have flat shapes, and are disposed inside the housing 50 so as to face the opening (the top surface panel 40) of the housing 50.

A circuit board (not illustrated) is disposed between a bottom surface of the housing 50 and the display panel 30. Circuit modules which configure a detecting unit (illustrated in FIG. 3) are provided on the circuit board.

Figure 3:
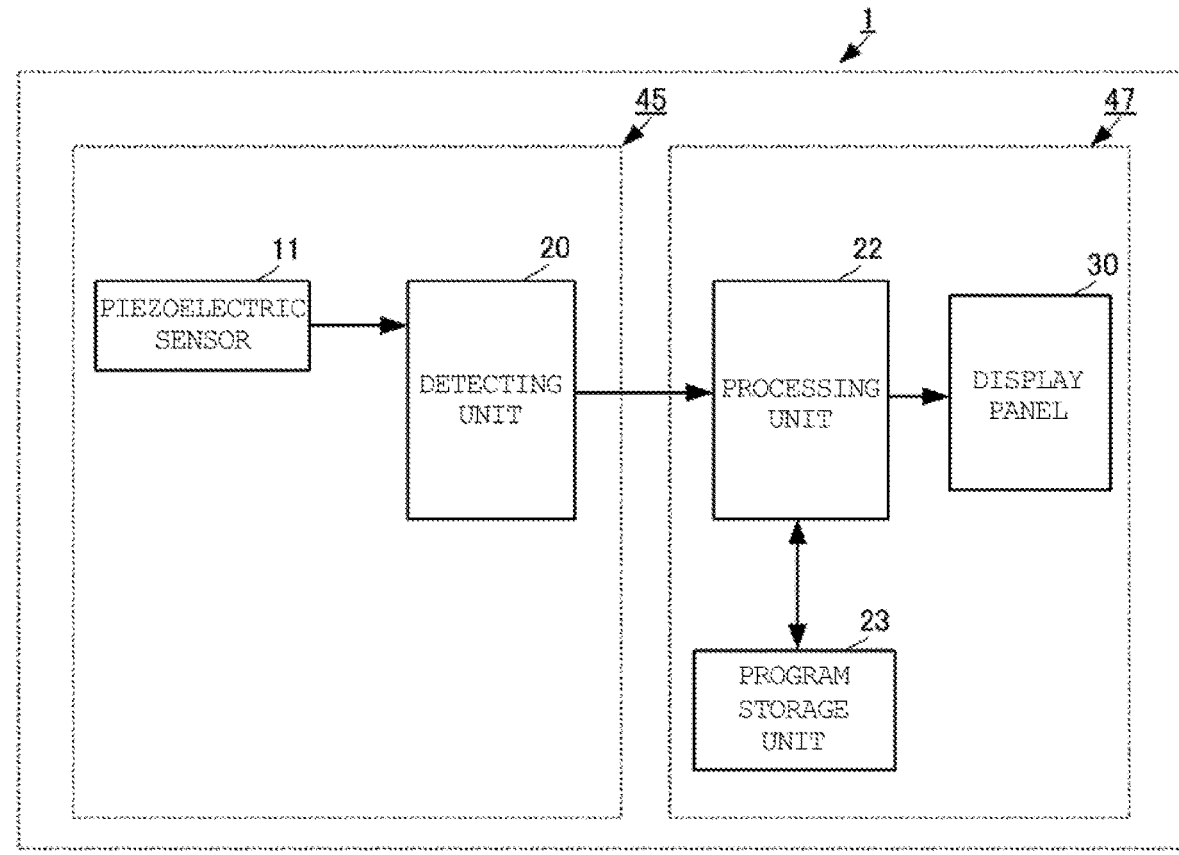
FIG. 3 is a block diagram of the display device.

As illustrated in FIG. 3, the detecting unit 20 is connected to the piezoelectric sensor 11 and a processing unit 22. The processing unit 22 is connected to the detecting unit 20, a program storage unit 23, and the display panel 30.

The display device 1 includes a touch input device 45 and a processing device 47. The piezoelectric sensor 11 and the detecting unit 20 configure the touch input device 45. The processing unit 22, the program storage unit 23, and the display panel 30 configure the processing device 47.

The processing unit 22 preferably includes a CPU and controls the operation of the processing device 47. To that end, the processing unit 22 reads an operation program stored in the program storage unit 23 and performs various types of processing. For example, the processing unit 22 controls the display panel 30 to display images, determines operation input contents according to a detection signal input from the detecting unit 20, and changes the displayed images.

The piezoelectric sensor 11 produces electric charges corresponding to a pressing operation on the top surface panel 40 which is the operation surface. The detecting unit 20 detects the electric charges produced by the piezoelectric sensor 11 and outputs the electric charges as a detection signal to the processing unit 22.

The display panel 30 is formed by, for example, a liquid crystal display element. In this example, as illustrated in FIG. 2, the display panel 30 includes a top polarizing plate 301, a liquid crystal panel 302, a back polarizing plate 303, and a backlight 304.

Figure 4:
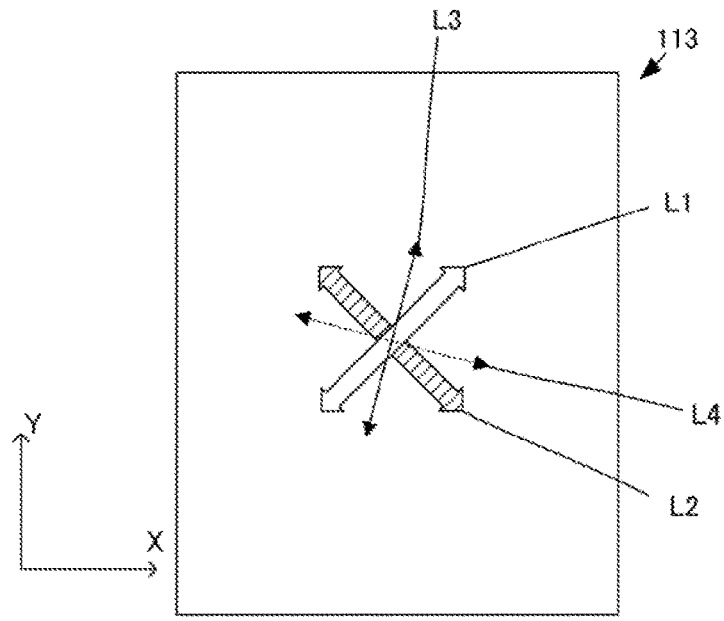
FIG. 4 is a view illustrating a relationship between slow axes.

The top polarizing plate 301 and the back polarizing plate 303 are disposed so as to sandwich the liquid crystal panel 302. The backlight 304 is disposed on a side opposite to the liquid crystal panel 302 with the back polarizing plate 303 interposed therebetween. Further, as illustrated in FIG. 4, a polarization direction L3 of the top polarizing plate 301 forms a 75° angle with respect to the X axis, and the polarization direction L4 of the back polarizing plate 303 forms a 165° angle with respect to the X axis.

Light output from the backlight 304 is polarized by the back polarizing plate 303, passes through the liquid crystal panel 302 and reaches the top polarizing plate 301. The liquid crystal panel 302 varies the amount of light passing through the top polarizing plate 302 per pixel under the control of the processing unit 22. The light output from the top polarizing plate 302 is output to the top surface panel 40 via the piezoelectric sensor 11. Thus, the top surface panel 40 displays various images.

The piezoelectric sensor 11 includes a first electrode film 111, a first electrode 112, a piezoelectric sheet 113, a second electrode 114, and a second electrode film 115 in order from the top surface side. The first electrode 112 and the second electrode 114 are disposed so as to cover the substantially entire surface of a principal surface of the piezoelectric sheet 113.

The first electrode 112 and the second electrode 114 are preferably made of materials having transparency. For example, the materials whose main components are indium tin oxide (ITO), zinc oxide (ZnO), and polythiophene are used. The first electrode 112 and the second electrode 114 are preferably formed in advance on principal surfaces of the first electrode film 111 and the second electrode film 115 by deposition.

One principal surface (a principal surface on the top surface side) of the piezoelectric sheet 113 is attached to the top surface panel 40. The piezoelectric sheet 113 deflects in a normal direction when the user presses down on the top surface panel 40, and produces electric charges. For the piezoelectric sheet 113, a material such as PVDF can be used yet a chiral polymer with high transparency is preferably used. For the piezoelectric sheet 113, the chiral polymer is more preferably uniaxially stretched polylactic acid (PLA) and is still more preferably poly-L-lactide (PLLA).

The main chain of the chiral polymer adopts a helical structure, and has piezoelectricity when the chiral polymer is uniaxially stretched and molecules are oriented. Further, the amount of electric charges produced by the uniaxially stretched chiral polymer is uniquely determined by the amount of displacement by which the top surface panel 40 is displaced in the normal direction.

A piezoelectric constant of the uniaxially stretched PLLA belongs to a group of very high piezoelectric constants among polymers. That is, it is possible to detect a pressing operation with a high sensitivity, and precisely output a deformation detection signal corresponding to the pressing amount.

Further, the chiral polymer produces piezoelectricity by orientation processing of molecules by stretching, and therefore there is no need to perform polling processing. Particularly, the polylactic acid does not have pyroelectricity, and therefore even when a piezoelectric sensor is disposed near the operation surface and heat of the user's finger is transmitted to the piezoelectric sensor, the electric charge amount to be detected does not change. Further, the PLLA does not show a temporal fluctuation of a piezoelectric constant, and is very stable.

In the present embodiment, as illustrated in FIG. 4, the piezoelectric sheet 113 is disposed such that a uniaxial stretching direction L1 forms an angle of approximately 45° with respect to the X direction and the Y direction. By disposing the piezoelectric sheet 113 in this way, it is possible to detect the pressing operation with a higher sensitivity.

In addition, a stretching ratio is preferably approximately three to eight times. Performing heat processing after stretching encourages crystallization of extended chain crystal of polylactic acid, so that the piezoelectric constant increases. Further, when the piezoelectric film is biaxially stretched, it is possible to provide the same effect as that of uniaxial stretching by varying stretching ratios of respective axes. When, for example, a given direction is the X axis and the film is stretched to eight times the film in the X axis direction, and the film is stretched to twice the film in the Y axis direction orthogonal to the X axis, it is possible to provide substantially the same effect in terms of the piezoelectric constant as an effect obtained when the film is uniaxially s=tretched to four times the film in the X axis direction. A simply uniaxially stretched sheet is likely to be broken in a stretching axis direction, and therefore it is possible to enhance the strength to some degree by biaxially stretching the PLLA as described above.

The first electrode film 111 is an example of an optical compensation layer of the present invention. The first electrode film 111 includes an intra-plane phase difference. As illustrated in FIG. 4, a slow axis L2 of the first electrode film 111 is orthogonal to a stretching direction of the piezoelectric sheet 113. The phase difference of the first electrode film 111 and the phase difference of the piezoelectric sheet 113 cancel each other out.

Figure 5:
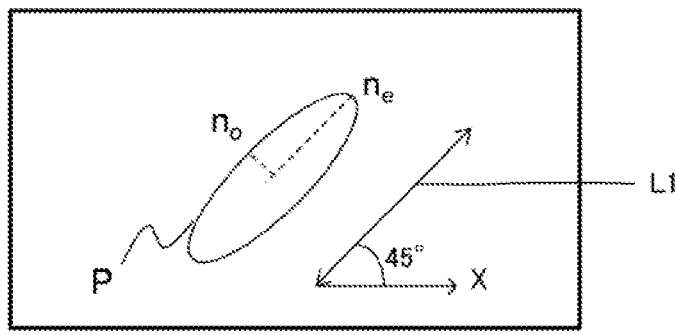
FIGS. 5(A), 5(B), 5(C), and 5(D) are views for explaining an optical compensation principle.
Figure 5:
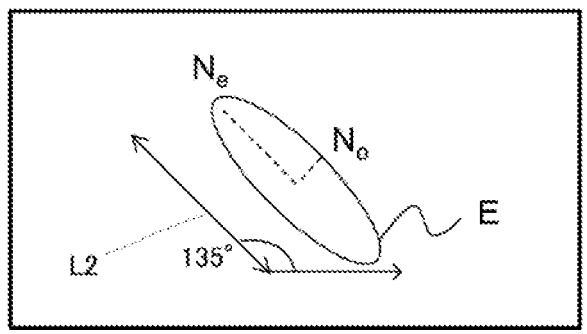
Figure 5:
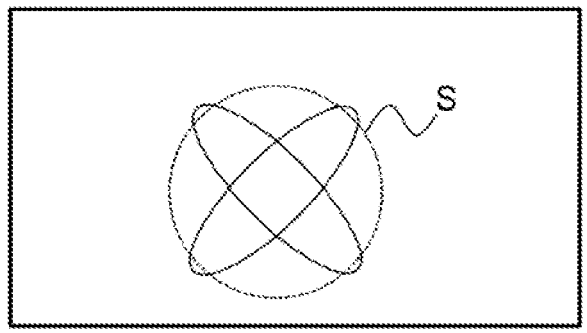
Figure 5:
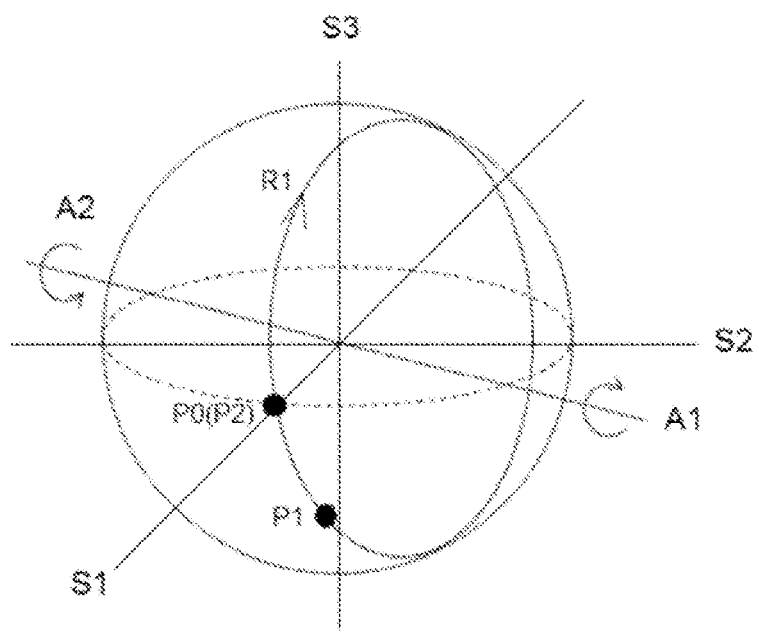

FIG. 5 is a view for explaining an optical compensation principle. First, as illustrated in FIG. 5(A), the stretching direction L1 of the piezoelectric sheet 113 forms 45° with respect to the X axis. Therefore, a major axis of the refractive index ellipsoid body P indicating the intra-plane phase difference of the piezoelectric sheet 113 forms 45° angle with respect to the X axis. Further, a retardation Re of the piezoelectric sheet 113 is expressed by Re=(ne−no)×d according to a refractive index no of an ordinary beam and a refractive index ne of an abnormal beam. Here, for example, when the refractive index no is 1.45, the refractive index ne is 1.47, and a thickness of the piezoelectric sheet 113 is d=50 μm, the retardation Re of the piezoelectric sheet 113 is 1000 nm.

On the other hand, as illustrated in FIG. 5(B), the slow axis L2 of the first electrode film 111 is disposed so as to be orthogonal to the stretching direction L1 of the piezoelectric sheet 113. Therefore, the major axis of the refractive index ellipsoid body E forms 135° with respect to the X axis. The retardation Re of the first electrode film 111 is, for example, 1000 nm according to Re=(Ne−No)×D when, for example, the refractive index No of the ordinary beam is 1.7, the refractive index Ne of the extraordinary beam is 1.725 and the thickness D is 40 μm.

Therefore, as illustrated in FIG. 5(C), the overlaid piezoelectric sheet 113 and first electrode film 111 are equivalent to a combination of the refractive index ellipsoid body P and the refractive index ellipsoid body E which cancel each other. Therefore, the piezoelectric sheet 113 and the first electrode film 111 are equivalent to a medium having an isotropic refractive index sphere S, and do not produce a phase difference with respect to light.

Next, a change in a beam polarized state will be described with reference to FIG. 5(D). FIG. 5(D) is a view illustrating the trajectory of the polarized state where light emitted from the top polarizing plate 301 passes through the piezoelectric sheet 113 and the first electrode film 111 on the Poincare sphere.

In FIG. 5(D), the polarized state of light emitted from the top polarizing plate 301 is located at P0 on the S1 axis of the Poincare sphere. In this case, when light passes through the piezoelectric sheet 113, the light polarized state rotates along a trajectory R1 based on the retardation Re of the piezoelectric sheet 113 around A1 (30°×2) as a rotation axis. Here, 30° which determine the rotation axis of A1 is an angle formed by L1 and L3 as seen from a beam traveling direction. As a result, the light polarized state reaches the position of P1 on the Poincare sphere.

Next, when light passes through the first electrode film 111, the light polarized state rotates about A2 (120°×2) as the axis. Here, 120° which determine the rotation axis of rotation of A2 is the angle formed by L2 and L3 as seen from the beam traveling direction. In this case, there is a shift of 180 degrees between the rotation axis A1 and the rotation axis A2, and the retardation Re of the first electrode film 111 is equal to the retardation Re of the piezoelectric sheet 113. Therefore, the light polarized state rotates from the position of the polarized state P1 back to the trajectory R1. Therefore, a polarized state P2 after the light passes through the first electrode film 111 is the same position as a polarized state P0.

Ideally, the polarization direction of the top polarizing plate 301 is preferably orthogonal or parallel to the stretching direction of the piezoelectric sheet 113. However, the polarization direction L3 of the top polarizing plate 301 and the polarization direction L4 of the back polarizing plate 303 shift due to manufacturing variations of the piezoelectric sensor 11, manufacturing variations of the display panel 30, or assembly variations of the piezoelectric sensor 11 and the display panel 30. Further, the stretching direction of the piezoelectric sheet which is optimal for detecting a pressing operation, and the polarization direction of the top polarizing plate of the display panel are not necessarily in the parallel or orthogonal state. For example, as illustrated in FIG. 4, the polarization direction L3 of the top polarizing plate 301 forms a 75° angle with respect to the X axis and is neither orthogonal nor parallel to the stretching direction of the piezoelectric sheet. In this case, when the light passes through the piezoelectric sheet 113, the polarized state shifts to the position of the polarized state P1, and changes to a position different from P1 on the trajectory R1 depending on the wavelength of the light. However, when the light passes through the first electrode film 111, the piezoelectric sensor 11 of the present embodiment rotates in a direction opposite to the direction in which the piezoelectric sensor 11 rotates from the position of the polarized state P0 to the position of the polarized state P1, and the rotation amount is the same for each wavelength. Consequently, it is possible to optically compensate for a wide band irrespectively of a wavelength.

Figure 6:
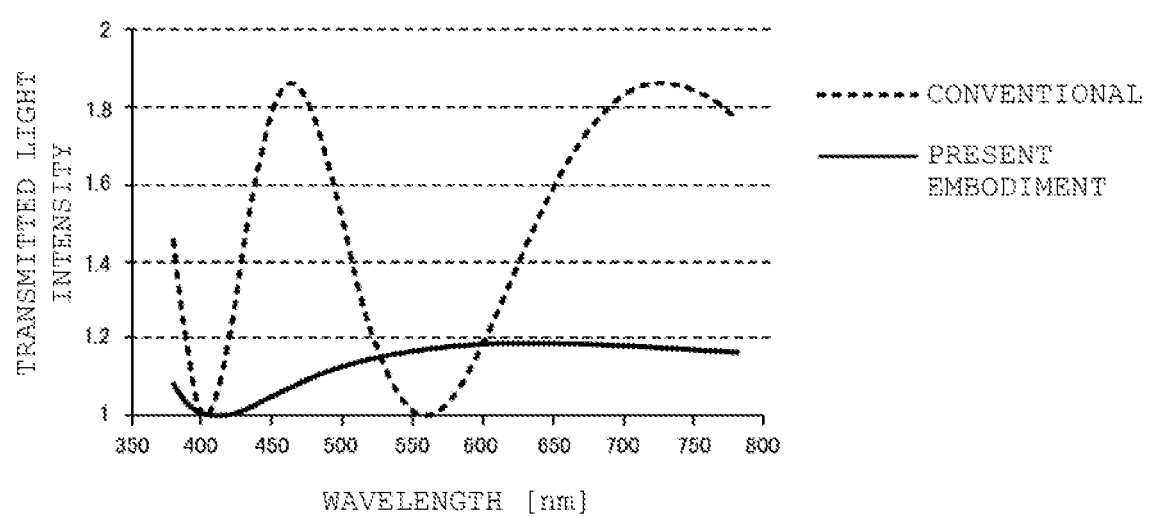
FIG. 6 is a view illustrating a transmitted light intensity of each wavelength.

FIG. 6 is a view illustrating a transmitted light intensity of each wavelength. The "transmitted light intensity" on the vertical axis of a graph illustrated in FIG. 6 indicates a transmitted light intensity of the polarization sunglasses in which the polarization direction is shifted by 45° with respect to the polarization direction L3 of the top polarizing plate 301, and the ratio with respect to the transmitted light intensity when the stretching direction L1 of the piezoelectric sheet 113 and the polarization direction L3 of the top polarizing plate 301 match.

The broken line in FIG. 6 indicates the transmitted light intensity when the polarization direction L3 of the top polarizing plate 301 forms a 75° angle with respect to the X axis and the intra-plane phase difference does not exist in the first electrode film 111 (i.e., is not optically compensated). In this way, when the transmitted light intensity is not optically compensated, the transmitted light intensity significantly changes depending on the wavelength, and changes the tone of images.

On the other hand, a solid line in FIG. 6 indicates a transmitted light intensity when the polarization direction L3 of the top polarizing plate 301 forms a 75° angle with respect to the X axis, the phase difference of the piezoelectric sheet 113 is canceled by the first electrode film 111 (i.e., is optically compensated). In this case, the transmitted light intensity changes slightly at each wavelength changes in the tone of the image are suppressed.

In the above example, the slow axis L2 of the first electrode film 111 is orthogonal to the stretching direction L1 of the piezoelectric sheet 113, and the retardation is the same. However, the slow axis of the second electrode film 115 and the stretching direction L1 of the piezoelectric sheet 113 may be orthogonal to one another, and the retardation may be the same. That is, at least one of the first electrode film 111 and the second electrode film 115 may compensate for the intra-plane phase difference of the piezoelectric sheet 113. Alternatively, another dielectric sheet different from the first electrode film 111 and the second electrode film 115 may be provided, and the dielectric sheet may compensate for the intra-plane phase difference of the piezoelectric sheet 113.

Further, the slow axis of the first or second electrode film 111, 115 do not need to be exactly orthogonal to the stretching direction of the piezoelectric sheet 113, and a shift of ±5° is within an allowable range. Also, the retardation value does not need to be the same.

Figure 7:
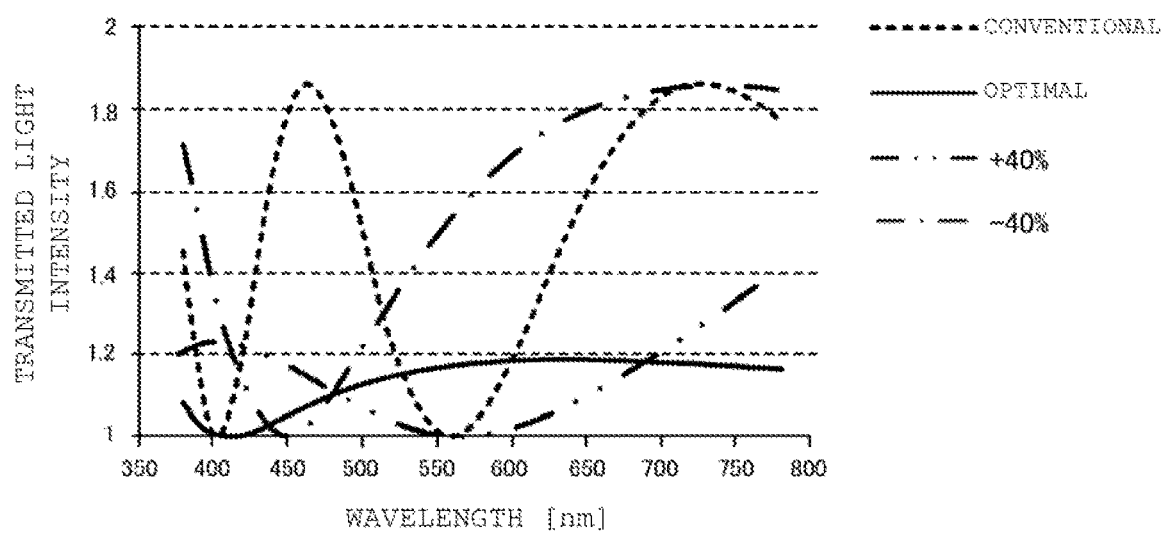
FIG. 7(A) is a view illustrating a result obtained by evaluating a change in a tone of an image with respect to optimal retardation.
FIG. 7(B) is a view illustrating a transmitted light intensity of each wavelength.

For example, when the retardation of the first electrode film or the second electrode film is within ±30% of the optimal retardation as illustrated in FIG. 7(A), a change in the tone when the display image is viewed with the polarized sunglasses on does not practically matter. In addition, when the retardation of the first electrode film or the second electrode film is +40% of the optimal retardation, the intensities of the wavelength of blue and the wavelength of red increase with respect to the intensity of the wavelength of green as illustrated in FIG. 7(B). In this case, while the change in the intensity ratio is small, green has high visibility and therefore the change in the tone is observed. In contrast, when the retardation of the first electrode film or the second electrode film is −40% of the optimal retardation, the intensity of the wavelength of red significantly increases compared to the wavelength of blue. Therefore, the significant change in the tone is strongly observed. Therefore, the retardation of the first electrode film or the second electrode film is preferably +40% to −30% of the optimal retardation and is more preferably within ±30%.

Figure 8:
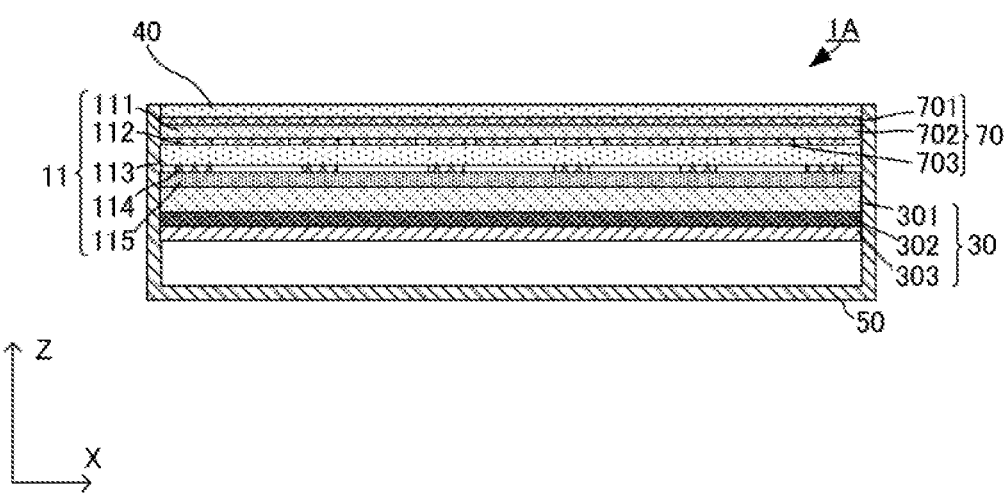
FIG. 8 is a side cross-sectional view of a display device according to modified example 1.

Next, FIG. 8 is a side sectional view of a display device 1A according to modified example 1. Components common to those in FIG. 2 will be assigned the same reference numerals and will not be described.

The display device 1A includes a capacitive sensor 70 in addition to the components of the display device 1. The capacitive sensor 70 is disposed closer to a top surface panel 40 with respect to a piezoelectric sensor 11. That is, each component is disposed along a Z direction in order of the capacitive sensor 70, the piezoelectric sensor 11, and the display panel 30 from a side of an opening (top surface panel 40) of a housing 50.

The capacitive sensor 70 preferably has a flat shape, and is disposed inside the housing 50 in parallel to the opening (top surface panel 40) of the housing 50.

The capacitive sensor 70 includes a first capacitance detection electrode 701, an insulation substrate 702 having a flat shape, and a second capacitance detection electrode 703. The insulation substrate 702 is made of a material having transparency, and is made of, for example, PMMA (acrylic resin). The first capacitance detection electrode 701 is formed on the principal surface on a top surface side of the insulation substrate 702, and a second capacitance detection electrode 703 is disposed on a principal surface on the back surface side.

All of the first capacitance detection electrodes 701 and the second capacitance detection electrodes 703 are preferably made of transparent materials. For example, the materials whose main components are indium tin oxide (ITO), zinc oxide (ZnO), and polythiophene are used.

The capacitive sensor 70 detects whether or not a touch operation is performed and the touch position based on the change in electrostatic capacitances detected by the first capacitance detection electrode 701 and the second capacitance detection electrode 703.

Further, a first electrode film 111 of the piezoelectric sensor 11 and the second capacitance detection electrode 703 of the capacitive sensor 70 are disposed on the same plane. That is, a first electrode 112 and the second capacitance detection electrode 703 are alternately arranged in parallel on the first electrode film 111. As described above, in the display device 1A according to modified example 1, it is possible to reduce the total number of films by providing part of the electrode of the capacitive sensor and part of the electrode of the piezoelectric sensor on the same film.

Figure 9:
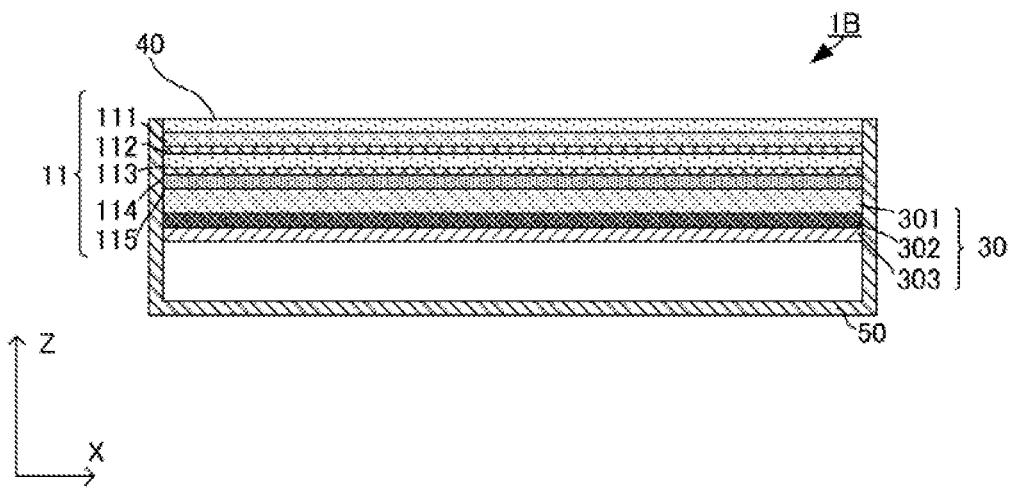
FIG. 9 is a side cross-sectional view of a display device according to modified example 2.
Figure 10:
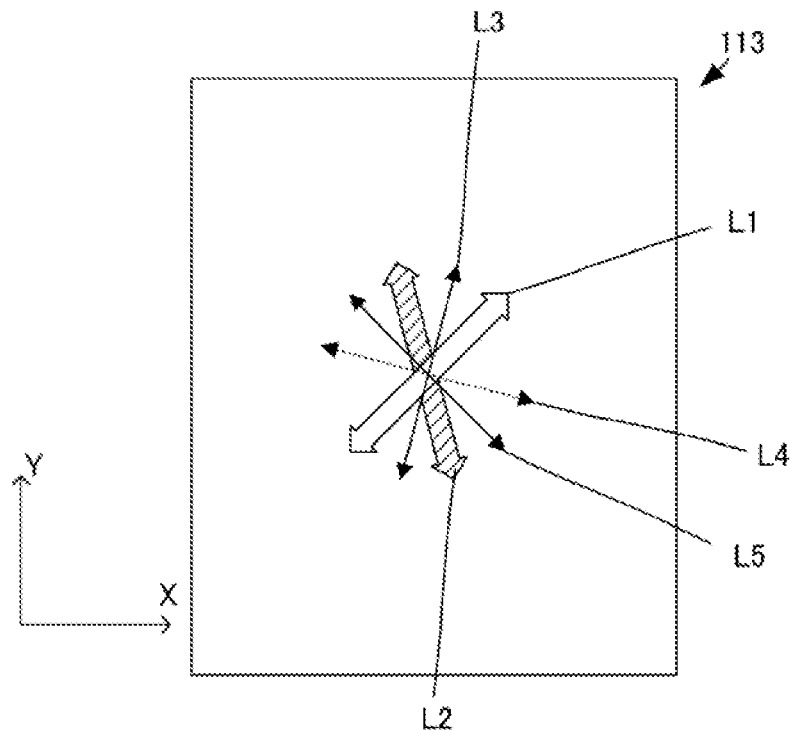
FIG. 10 is a view illustrating the relationship between slow axes.

FIG. 9 is a side sectional view of a display device 1B according to modified example 2. FIG. 10 is a view illustrating a relationship between slow axes of the display device 1B according to modified example 2.

The display device 1B according to modified example 2 employs the same configuration illustrated in FIG. 9 as the display device 1 illustrated in FIG. 2. However, in the display device 1B, a first electrode film 111 has an intra-plane phase difference. A slow axis L2 of the first electrode film 111 forms approximately a 45° angle with respect to a polarization direction L3 of a top polarizing plate 301. Further, the retardation of the first electrode film 111 is λ/4 of a wavelength λ of light. In addition, a second electrode film 115 of the display device 1B has an intra-plane phase difference. A slow axis L5 of the second electrode film 115 forms approximately 90° with respect to a stretching direction L1 of a piezoelectric sheet 113.

Figure 11:
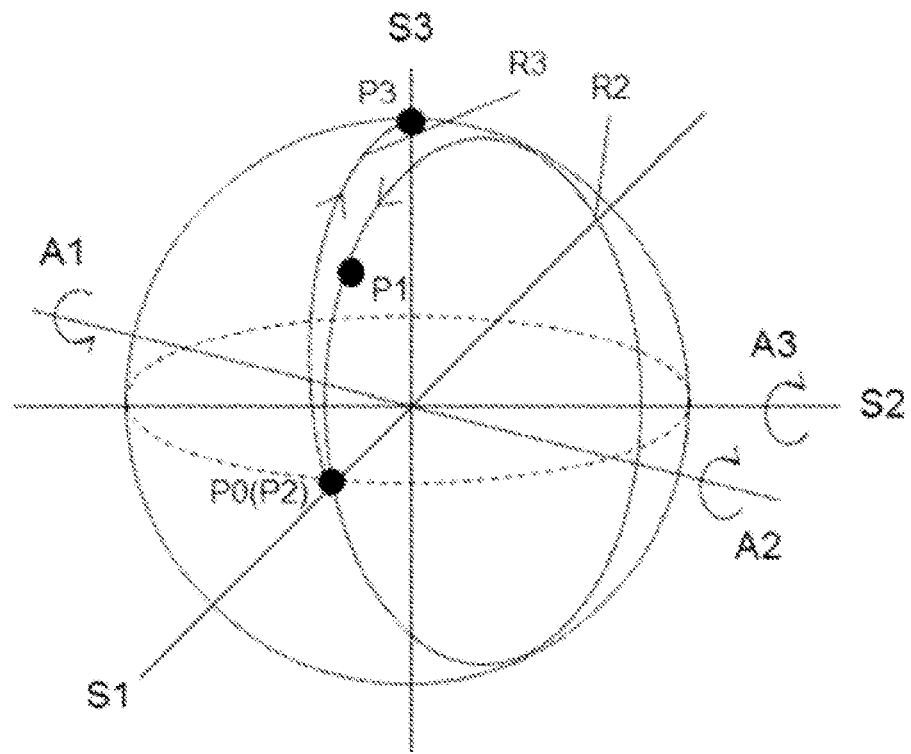
FIG. 11 is a view for explaining an optical compensation principle.

A change in a light polarized state will be described with reference to FIG. 11. As indicated by a Poincare sphere in FIG. 11, the polarized state of light emitted from the top polarizing plate 301 is located at P0. Here, the polarized state where light passes through the second electrode film 115 rotates along a trajectory R2 based on the retardation of the second electrode film 115 around A1 (120°×2) as the rotation axis and reaches a position P1. Here, 120° which determine the rotation axis of A1 is the angle formed by L3 and L5 as seen from a beam traveling direction. Next, the polarized state where light passes through the piezoelectric sheet 113 rotates based on the retardation of the piezoelectric sheet 113 around A2 (30°×2) as an axis. Here, 30° which determine the rotation axis of A2 is the angle formed by L3 and L1 as seen from the beam traveling direction. In this case, the retardation of the second electrode film 115 and the retardation of the piezoelectric sheet 113 are equal, and therefore rotation reverses from P1 along the trajectory R2. Therefore, the polarized state P2 after light passes through the piezoelectric sheet 113 is the same position as P0.

Further, the polarized state where light passes through the first electrode film 111 rotates along a trajectory R3 based on a retardation of the first electrode film 111 around A3 (45°×2) as the rotation axis, and reaches a position P3. Here, 45° which determine the rotation axis of A3 is an angle formed by L3 and L2 as seen from the beam traveling direction.

The position P3 exists on an S3 axis of the Poincare sphere. Therefore, the light having passed through the first electrode film 111 is in a circularly polarized state. Therefore, even when a polarization direction of the top polarizing plate 301 and the polarization direction of the polarization sunglasses are orthogonal to each other, light is transmitted without blackout and the image can be visually recognized.

Figure 12:
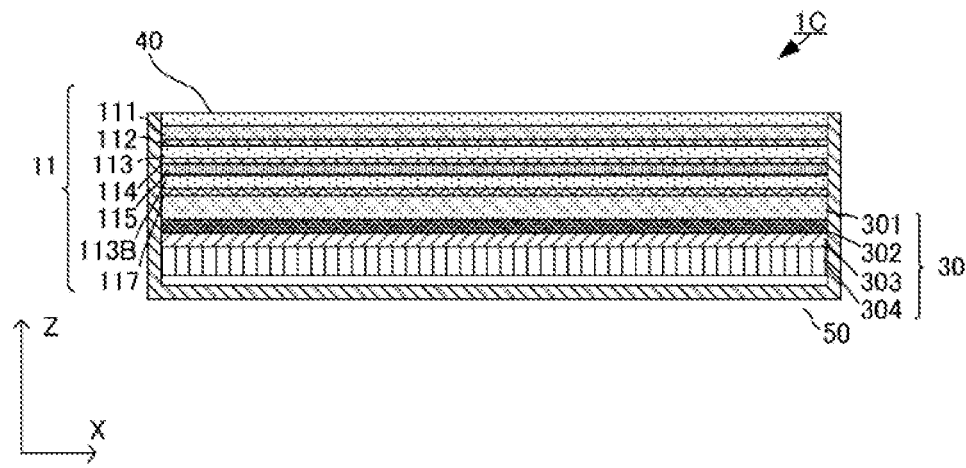
FIG. 12 is a side cross-sectional view of a display device according to modified example 3.

Next, FIG. 12 is a side cross-sectional view of a display device 1C according to modified example 3. Components common to those in FIG. 2 will be assigned the same reference numerals and will not be described.

In addition to the configuration of the display device 1, the display device 1C further includes an optical compensation piezoelectric sheet 113B stretched in a uniaxial direction, and a third electrode 117. In this case, a first electrode film 111 of the display device 1 has no intra-plane phase difference. The optical compensation piezoelectric sheet 113B is disposed closer to a display panel 30 with respect to the first electrode film 111.

The third electrode 117 is also made of transparent materials. Preferably materials whose main components are indium tin oxide (ITO), zinc oxide (ZnO), and polythiophene are used. The third electrode 117 is preferably formed in advance on a principal surface of a second electrode film 115 by deposition.

In modified example 3, a second electrode 114 functions as a ground electrode. The first electrode 112 functions as a detection electrode of a piezoelectric sheet 113. The third electrode 117 functions as a detection electrode of the optical compensation piezoelectric sheet 113B.

Figure 13:
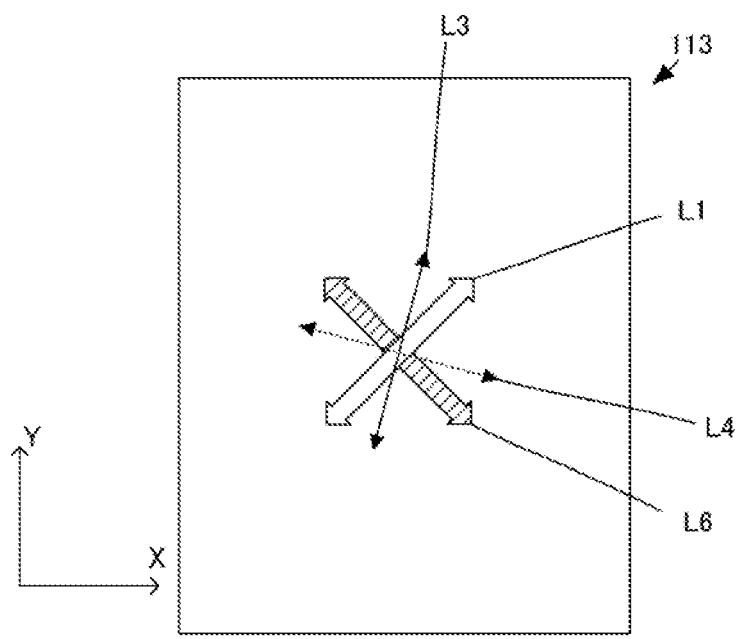
FIG. 13 is a view illustrating a relationship between slow axes.

In modified example 3, as illustrated in FIG. 13, the piezoelectric sheet 113 is disposed such that a uniaxial stretching direction L1 forms an angle of approximately 45° with respect to an X direction and a Y direction.

The optical compensation piezoelectric sheet 113B is an example of the optical compensation layer of the present invention. The optical compensation piezoelectric sheet 113B has an intra-plane phase difference. As illustrated in FIG. 13, a uniaxial stretching direction L6 of the optical compensation piezoelectric sheet 113B is orthogonal to the uniaxial stretching direction L1 of the piezoelectric sheet 113. As a result, the phase difference of the optical compensation piezoelectric sheet 113B and a phase difference of the piezoelectric sheet 113 cancel each other out. The optical compensation principle is the same as that in the first embodiment.

As described above, the configuration of modified example 3 further includes the optical compensation piezoelectric sheet 113B. Accordingly, a deformation detection signal corresponding to an amount of pressing force becomes significant, so that it is possible to detect a pressing operation with a higher sensitivity. Further, in modified example 3, the piezoelectric sheet 113 and the optical compensation piezoelectric sheet 113B are made of the same material (e.g., PLLA), so that it is not necessary to separately manufacture optical compensation films. In this regard, the uniaxial stretching direction L6 of the optical compensation piezoelectric sheet 113B does not need to be exactly orthogonal to the uniaxial stretching direction L1 of the piezoelectric sheet 113. Even when, for example, there is a shift of ±5°, an optical compensation function is secured.

DESCRIPTION OF REFERENCE SYMBOLS 1, 1A, 1B: display device
11: piezoelectric sensor
20: detecting unit
22: processing unit
23: program storage unit
30: display panel
40: top surface panel
45: touch input device
47: processing device
50: housing
70: capacitive sensor
111: first electrode film
112: first electrode
113: piezoelectric sheet
113B: optical compensation piezoelectric sheet
114: second electrode
115: second electrode film
117: third electrode
301: top polarizing plate
302: liquid crystal panel
303: back polarizing plate
304: backlight

The invention claimed is:

1. A piezoelectric sensor comprising:
a piezoelectric sheet which is stretched in a uniaxial direction;
an electrode which detects an electric charge generated in the piezoelectric sheet; and
a non-piezoelectric optical compensation layer which includes a slow axis disposed on at least one side of the piezoelectric sheet and intersects the uniaxial direction, and optically compensates for a phase difference produced when the piezoelectric sheet is stretched in the uniaxial direction.

2. The piezoelectric sensor according to claim 1, wherein a retardation value of the optical compensation layer is within a range of 40% to −30% of a retardation value of the piezoelectric sheet.

3. The piezoelectric sensor according to claim 1, wherein a retardation value of the optical compensation layer is within a range of ±30% of a retardation value of the piezoelectric sheet.

4. The piezoelectric sensor according to claim 1, wherein the slow axis of the optical compensation layer is orthogonal to the uniaxial direction.

5. The piezoelectric sensor according to claim 2, wherein the slow axis of the optical compensation layer is orthogonal to the uniaxial direction.

6. The piezoelectric sensor according to claim 3, wherein the slow axis of the optical compensation layer is orthogonal to the uniaxial direction.

7. The piezoelectric sensor according to claim 1, wherein the piezoelectric sheet contains polylactic acid.

8. The piezoelectric sensor according to claim 1, wherein:
the electrode is formed on an electrode film; and
the electrode film is the optical compensation layer.

9. The piezoelectric sensor according to claim 2, wherein:
the electrode is formed on an electrode film; and
the electrode film is the optical compensation layer.

10. The piezoelectric sensor according to claim 3, wherein:
the electrode is formed on an electrode film; and
the electrode film is the optical compensation layer.

11. The piezoelectric sensor according to claim 4, wherein:
the electrode is formed on an electrode film; and
the electrode film is the optical compensation layer.

12. A touch panel comprising:
the piezoelectric sensor according to claim 1; and
an operation surface.

13. A touch input device, comprising:
the touch panel according to claim 12; and
a detector which detects the charge generated in the piezoelectric sensor by a pressing operation on the operation surface.

14. A display device, comprising:
the touch panel according to claim 12; and
a display panel,
wherein the display panel forms a display image by controlling light emitted toward the operation surface, and includes a top polarizing plate which is disposed closer to the operation surface than the display panel.

15. The display device according to claim 14, wherein
a second optical compensation layer is disposed on a side opposite to the optical compensation layer so as to sandwich the piezoelectric film, and
the second optical compensation layer includes a slow axis which forms 45 degrees with respect to a polarization direction of the top polarizing plate.

16. A piezoelectric sensor comprising:
a piezoelectric sheet which is stretched in a uniaxial direction;
an electrode which detects an electric charge generated in the piezoelectric sheet; and
a non-piezoelectric optical compensation layer which includes a slow axis disposed on at least one side of the piezoelectric sheet and intersects the uniaxial direction, and has a retardation value within ±30% of a retardation value of the piezoelectric sheet.

* * * * *